United States Patent
Minakuchi et al.

(10) Patent No.: US 10,340,413 B2
(45) Date of Patent: Jul. 2, 2019

(54) SEMICONDUCTOR LIGHT EMITTING ELEMENT

(71) Applicant: NICHIA CORPORATION, Anan-shi (JP)

(72) Inventors: Hitoshi Minakuchi, Anan (JP); Kenichi Matsui, Anan (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 15/409,546

(22) Filed: Jan. 19, 2017

(65) Prior Publication Data

US 2017/0133551 A1    May 11, 2017

Related U.S. Application Data

(63) Continuation of application No. 14/742,716, filed on Jun. 18, 2015, now Pat. No. 9,583,674.

(30) Foreign Application Priority Data

Jun. 18, 2014   (JP) .................. 2014-125673

(51) Int. Cl.
*H01L 33/20*   (2010.01)
*H01L 33/00*   (2010.01)

(52) U.S. Cl.
CPC ........ *H01L 33/0095* (2013.01); *H01L 33/007* (2013.01); *H01L 33/20* (2013.01)

(58) Field of Classification Search
None
See application file for complete search history.

(56) References Cited

U.S. PATENT DOCUMENTS

| | | | |
|---|---|---|---|
| 8,236,591 B2 | 8/2012 | Ichihara et al. | |
| 8,728,916 B2 | 5/2014 | Tamemoto | |
| 2007/0298529 A1* | 12/2007 | Maeda | B23K 26/0057 438/33 |
| 2008/0035611 A1* | 2/2008 | Kuno | B23K 26/0057 219/69.1 |
| 2010/0187542 A1 | 7/2010 | Ichihara et al. | |

(Continued)

FOREIGN PATENT DOCUMENTS

| | | |
|---|---|---|
| JP | 3449201 B2 | 6/1999 |
| JP | 3604550 B2 | 7/1999 |

(Continued)

OTHER PUBLICATIONS

Office Action with Form PTO-892 Notice of References Cited issued by the U.S. Patent and Trademark Office for the U.S. Appl. No. 14/742,716, dated Apr. 15, 2016.

(Continued)

*Primary Examiner* — Bradley Smith
(74) *Attorney, Agent, or Firm* — Mori & Ward, LLP (57) ABSTRACT

A semiconductor light emitting element includes a substrate and a semiconductor structure. The substrate has a first main surface, a second main surface and side surfaces. The side surfaces form a first altered area in which voids are positioned in a first imaginary line and a second imaginary line different from the first imaginary line in the thickness direction of the substrate. The semiconductor structure is provided on or above the first main surface of the substrate.

18 Claims, 9 Drawing Sheets

(56) References Cited

U.S. PATENT DOCUMENTS

| | | | |
|---|---|---|---|
| 2011/0298084 A1* | 12/2011 | Tamemoto | B23K 26/0057 |
| | | | 257/507 |
| 2012/0319138 A1 | 12/2012 | Fujiwara et al. | |
| 2013/0089969 A1 | 4/2013 | Wagner | |
| 2013/0217163 A1 | 8/2013 | Yoneda | |

FOREIGN PATENT DOCUMENTS

| | | |
|---|---|---|
| JP | 2006-245043 | 9/2006 |
| JP | 2007-254185 | 10/2007 |
| JP | 5221007 B2 | 12/2007 |
| JP | 2008-98465 | 4/2008 |
| JP | 2010-24068 | 2/2010 |
| JP | 2012-235012 | 11/2012 |
| JP | 2013-4741 | 1/2013 |
| JP | 2013-51298 | 3/2013 |
| JP | 5267462 B2 | 8/2013 |
| JP | 2014-36062 | 2/2014 |
| JP | 5573832 B2 | 8/2014 |
| WO | WO 2012/017771 | 2/2012 |

OTHER PUBLICATIONS

Notice of Allowance issued by the U.S. Patent and Trademark Office for the U.S. Appl. No. 14/742,716, dated Oct. 19, 2016.

* cited by examiner

| EXAMPLES | DEPTH OF 1ST CONDENSING POS. | Po (W) | | | | | | |
|---|---|---|---|---|---|---|---|---|
| | | 0.14 | 0.15 | 0.16 | 0.17 | 0.18 | 0.19 | 0.2 |
| SAMPLE 1 | 30 μm | × | | × | | × | | |
| SAMPLE 2 | 34 μm | O | | ◎ | | ◎ | | ◎ |
| SAMPLE 3 | 36 μm | | | | | | | ◎ |
| SAMPLE 4 | 38 μm | O | ◎ | ◎ | | ◎ | | ◎ |
| SAMPLE 5 | 40 μm | | | ◎ | | | | ◎ |
| SAMPLE 6 | 42 μm | O | ◎ | ◎ | ◎ | ◎ | ◎ | ◎ |
| SAMPLE 7 | 44 μm | | O | | | | | |
| SAMPLE 8 | 46 μm | | O | ◎ | | | | ◎ |

SEMICONDUCTOR LIGHT EMITTING ELEMENT

CROSS-REFERENCE TO RELATED APPLICATIONS

The present application is a continuation application of the U.S. patent application Ser. No. 14/742,716 filed on Jun. 18, 2015, which claims priority under 35 U.S.C. § 119 to Japanese Patent Application No. 2014-125,673, filed Jun. 18, 2014. The contents of these applications are incorporated herein by reference in their entirety.

BACKGROUND

1. Field of the Invention

The present disclosure relates to a semiconductor light emitting element.

2. Description of the Related Art

Semiconductor light emitting elements can be small and highly effective in power consumption, and can emit vivid color light. In addition, in the case of light emitting elements of semiconductor elements, there are no concerns about bulb burnout and the like. In addition, semiconductor light emitting elements have features such as excellent initial driving characteristics, resistance to vibration or ON/OFF repeats. Since semiconductor light emitting elements have these excellent features, semiconductor light emitting elements such as light emitting diode (hereinafter, occasionally referred to as "LED") and laser diode (hereinafter, occasionally referred to as "LD") have been used as various types of light sources. In particular, in recent years, light emitting diodes receive attention as light source for lighting replacement of fluorescent lamps, in other words, as next-generation lighting having long life and low power consumption. From this viewpoint, further improvement is required in light output and light emission efficiency.

Such a semiconductor light emitting element is produced by dividing a sapphire substrate with semiconductor layers into chips after the semiconductor layers are epitaxially grown on the sapphire substrate. In the known techniques, the wafer of the substrate and the semiconductor layers, which are stacked on the substrate, is divided into chips by a dicer, a scriber, a laser scriber, or the like. In the case where nitride semiconductors are used for the semiconductor layers, sapphire substrates are typically used as the growth substrate.

Methods for dividing a wafer including a sapphire substrate have been proposed which irradiate the wafer with laser beam from the back surface side of the sapphire substrate using a femtosecond pulse laser so that altered areas are produced inside the sapphire substrate whereby producing division grooves or cracks from extending from the altered areas. See Japanese Patent Laid-Open Publication Nos. JP 2006-245,043 A, and 2008-98,465 A, for example.

SUMMARY OF THE INVENTION

According to one aspect of the present invention, a semiconductor light emitting element includes a substrate and a semiconductor structure. The substrate has a first main surface, a second main surface and side surfaces. The side surfaces form a first altered area in which voids are positioned in a first imaginary line and a second imaginary line different from the first imaginary line in the thickness direction of the substrate. The semiconductor structure is provided on or above the first main surface of the substrate.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE EMBODIMENTS

The embodiments will now be described with reference to the accompanying drawings, wherein like reference numerals designate corresponding or identical elements throughout the various drawings.

First Embodiment (Semiconductor Light Emitting Element 10)

The schematic construction of a semiconductor light emitting element 10 which can be produced by a production method according to the first embodiment of the present invention is first described.

Figure 1:
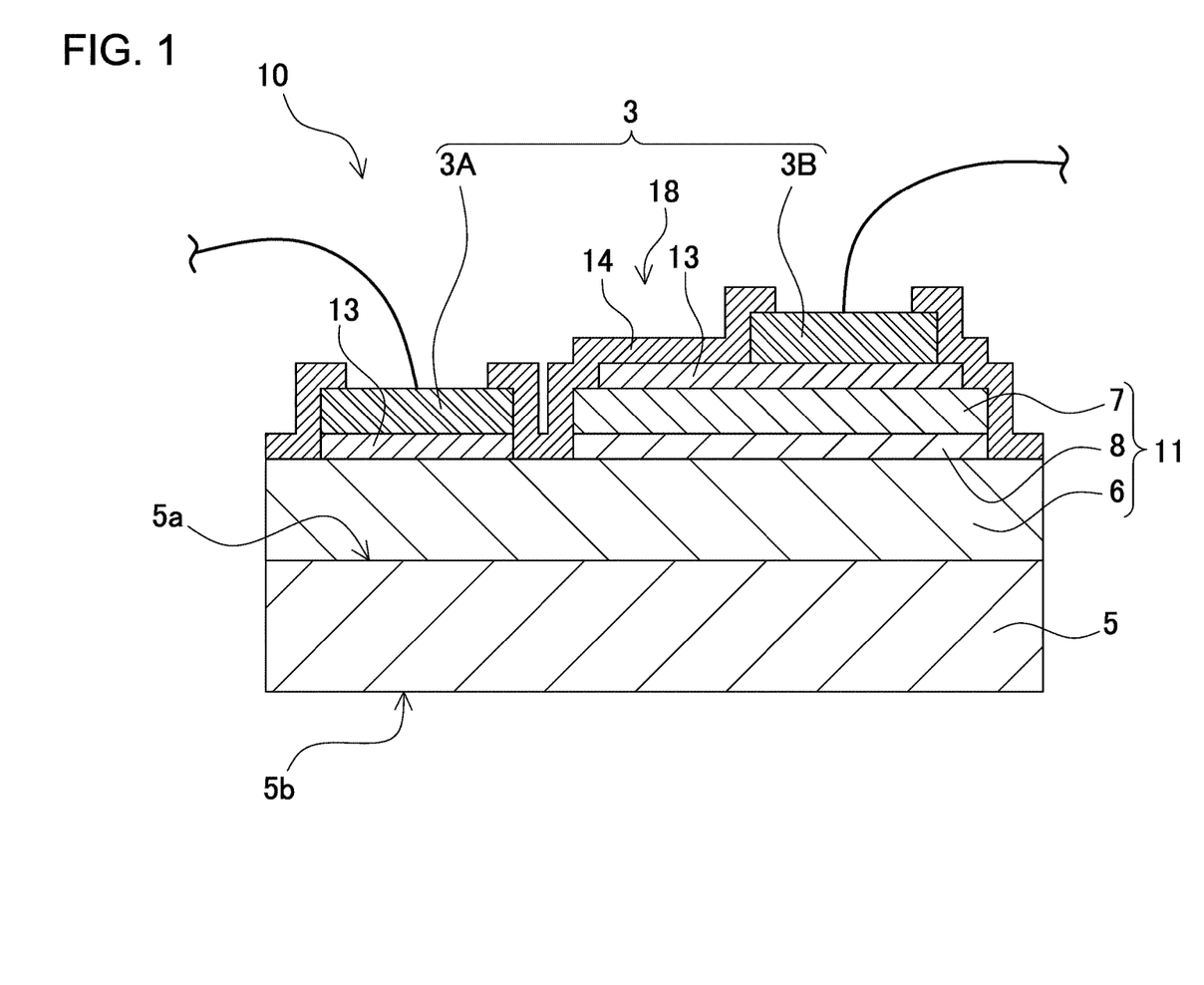
FIG. 1 is a cross-sectional view showing a semiconductor light emitting element according to a first embodiment of the present invention.

FIG. 1 shows a cross sectional view of the semiconductor light emitting element 10. As shown in FIG. 1, the semiconductor light emitting element 10 includes nitride semiconductor layers as a semiconductor structure 11 is deposited on or above a first main surface 5a, which is one of a pair of main surfaces of a substrate 5. Specifically, the semiconductor structure 11 of the semiconductor light emitting element 10 includes an n-type semiconductor layer as a first semiconductor layer 6, an active layer 8, and a p-type semiconductor layer as a second semiconductor layer 7, which are deposited in this order on the front surface side as the first main surface 5a of the pair of main surfaces of the substrate 5. In addition, n-side and p-side pad electrodes 3A and 3B are electrically connected to the n-type and p-type semiconductor layers, respectively. When electric power is supplied to the semiconductor light emitting element 10 from an external source through the n-side and p-side electrodes 3A and 3B, the active layer 8 emits light so that the light extracts mainly through a side opposite to a second surface 5b of the substrate 5 shown in FIG. 1. That is, in the semiconductor light emitting element 10 shown in FIG. 1, a side (upper side of FIG. 1) of a surface where the electrodes 3A and 3B are formed serves as a main light-extracting surface 18. The active layer 8 serves as a light emitting layer. The center wavelength of light emitted by the active layer 8 can be within a range of 360 to 650 nm, for example.

More specifically, a light-transmissive electrically-conducting layer 13 is formed on each of the n-type and p-type semiconductor layers, and the n-side and p-side pad electrodes 3A and 3B are formed on the light-transmissive electrically-conducting layer 13. In addition, only predetermined areas of surfaces of the n-side and p-side pad electrode 3A and 3B are exposed so that the areas except for the predetermined areas are covered by an electrically-insulating protection film 14.

In the case where the substrate 5 is an insulating substrate, the n-side and p-side pad electrodes are arranged on the first main surface 5a side (upper surface side of the semiconductor structure 11) as shown in FIG. 1.

(Production Method of Semiconductor Light Emitting Element)

A method for producing of the light emitting element 10 is now described with reference to Figures.

(Wafer Preparation Process)

First, a wafer is prepared which includes the semiconductor structure 11 on the first main surface 5a of the substrate 5.

The size, thickness, and the like of the substrate 5 are not particularly limited as long as the semiconductor structure 11 can be grown on the substrate. For example, sapphire substrates can be used as the substrate 5. As stated above, although sapphire substrates are materials in which cracks less easily extend, according to the method of the present embodiment, the cracks can extend even in sapphire substrates. An illustrative sapphire substrate is now described. The thickness of the sapphire substrate can be within the range of about 50 μm to 2 mm, for example. The sapphire substrate can have a thickness of about 200 μm to 2 mm until the semiconductor structure 11 and the electrodes are formed. After the semiconductor structure and the electrodes are formed, the thickness of the sapphire substrate can be reduced to the range of about 50 to 200 μm, preferably about 100 to 200 μm by polishing, or the like.

In terms of the light output and light emission efficiency, it is preferable that the semiconductor structure 11, which is grown on the first main surface 5a of the sapphire substrate 5, include a first-conductivity type semiconductor layer, a light-emitting layer, and a second-conductivity type semiconductor layer that are deposited in this order from the sapphire substrate 5 side, for example. However, the semiconductor structure is not limited to this. Other light emitting structures may be used as the semiconductor structure 11.

For example, nitride semiconductors can be used for the semiconductor structure 11. Nitride semiconductors emit light in a short wavelength range in the visible light range, the near-ultraviolet range, or a wavelength range shorter than these ranges. Accordingly, white light can be easily obtained by mixing the light from the semiconductor structure 11 with light emitted by a light conversion member (phosphor etc.) which can be excited by the light from the semiconductor structure 11. The semiconductor structure is not limited to nitride semiconductors. The semiconductor structure may be formed of other semiconductors such as InGaAs-based semiconductors and GaP-based semiconductors. In the case where sapphire substrates are used as the substrate 5, the semiconductor structure 11 that is formed of the nitride semiconductors can be easily grown on the substrate.

Any suitable known methods for growing semiconductor layers can be employed. Although not limited, examples of the methods can be provided by MOCVD (Metallorganic Chemical Vapor Deposition), MOVPE (Metal-Organic Chemical Vapor Deposition), HVPE (Hydride Chemical Vapor Deposition), and the like. In particular, MOCVD is preferable, since semiconductor layers with good crystallinity can be grown by MOCVD. In addition, grooves for dividing the wafer may be formed on the semiconductor layer side if necessary.

(Division Process)

Figure 2:
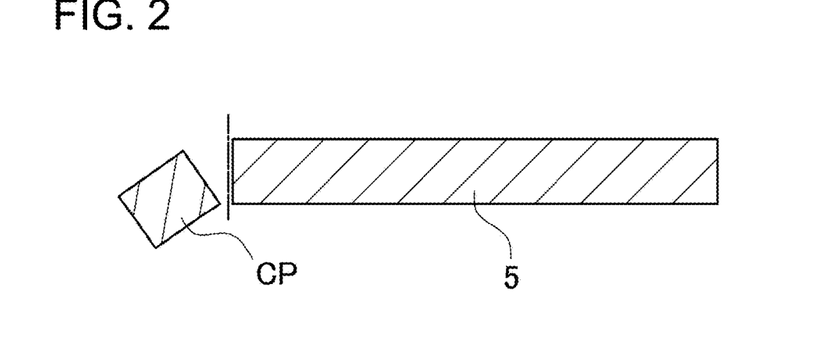
FIG. 2 is a schematic cross-sectional view showing the process for separating a semiconductor light emitting element chip from a wafer.
Figure 3:
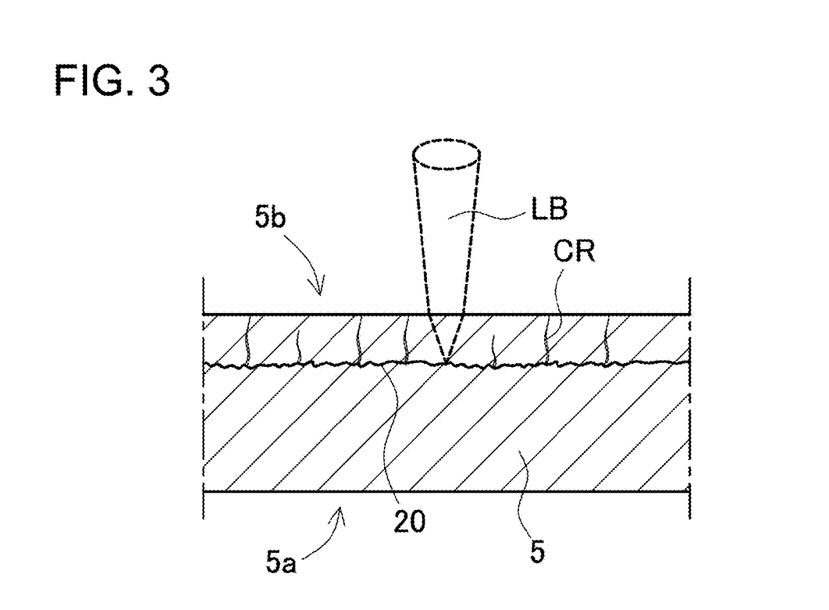
FIG. 3 is a schematic cross-sectional view showing the process for irradiating a first light-condensing position with first laser beam from the back-surface side of a substrate.

After the semiconductor structure 11 is grown on the sapphire substrate, the sapphire substrate 5 is divided into chips CP as shown in FIG. 2. In a division process, laser beam LB is emitted inside the sapphire substrate 5 so that the irradiated part of the sapphire substrate becomes brittle, that is, the properties of the irradiated part of the sapphire substrate are altered. FIG. 3 is a cross-sectional view showing the irradiation.

As shown in FIG. 3, a laser beam machine (e.g., femtosecond laser) emits the laser beam LB toward the inside of the sapphire substrate 5 from the back-surface side of the sapphire substrate 5. The irradiation of the laser beam LB can alter some properties of portion irradiated by the laser beam LB and their peripheral parts of the sapphire substrate, so that altered areas 20 are formed. Cracks CR can be produced from the altered areas 20 as the starting points, and extend toward the back-surface side of the sapphire substrate 5. A pulse laser can be used for irradiation with the laser beam LB. The laser beam LB scans the surface of the sapphire substrate 5 so that a plurality of altered areas 20 are formed inside the sapphire substrate 5, and the altered areas 20 are aligned to form a belt shape extending the scanning directions in a cross-sectional view. In this case, the cracks CR can be formed and extend from the altered areas 20 toward the second main surface 5b, which is the back surface of the sapphire substrate 5. After that, forces are applied to the wafer by pressing a pressing member against the wafer or other means so that the cracks CR extend toward the first main surface 5a as the front surface of the sapphire substrate 5 (the side where the semiconductor structure 11 is deposited) whereby dividing the wafer into chips (breaking process). In this specification, the altered area 20 refers to the area inside the substrate 5 that becomes brittle due to laser irradiation. In other words, the altered area 20 is the area where voids are produced immediately after the laser irradiation, and larger number of small asperities are observed as compared with the other areas after the wafer is divided into chips.

In order to accurately divide the wafer, it is preferable to start the breaking process after the cracks, which extend due to the irradiation of the laser beam, reach the second main surface of the sapphire substrate. However, in the case where the sapphire substrate is thick, or in the case where a compression stress is produced in proximity to the back surface of the substrate, for example, a long time may be required until the cracks extend after the first laser scanning. For example, 24 hours or more may be required in such cases in contrast to conventional cases where several minutes are required for extension of the cracks. If the waiting time until the cracks extend were longer, then the cycle time for producing the semiconductor light emitting element also became longer, thus the production efficiency would be inferior.

Figure 4:
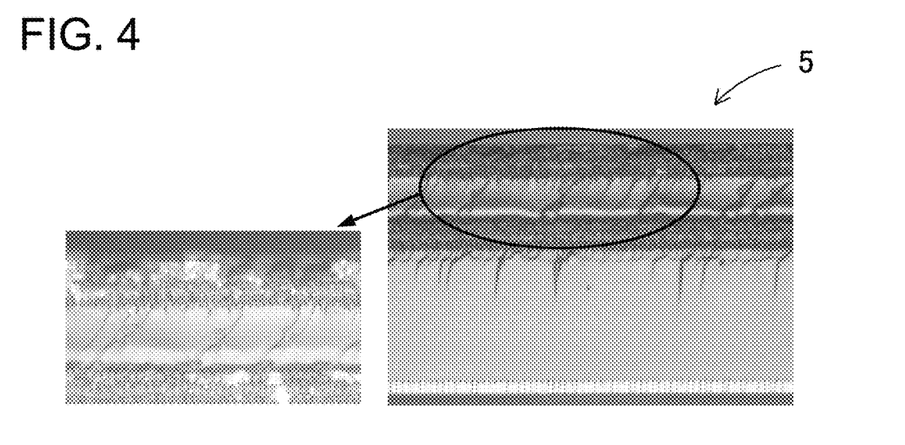
FIG. 4 shows micrographs of the separated surface of the sapphire substrate, which is formed by irradiating a part of the sapphire substrate in proximity to its back surface with first laser beam, in the test conducted by the inventors.
Figure 5:
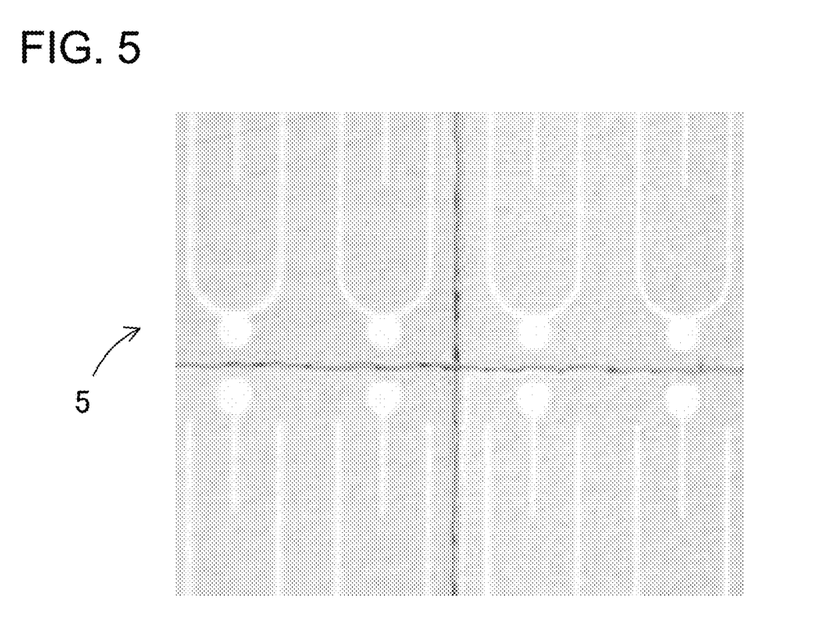
FIG. 5 is a photograph showing breaking lines of altered areas which are produced by irradiating the sapphire substrate with first laser beam and reaches the back surface in the test conducted by the inventors.

In order to solve this problem, the inventors have considered a method for reducing the crack extension time by setting the light-condensing position of the laser beam close to the second main surface 5b, which is the back surface of the sapphire substrate 5, as shown in FIG. 4. FIG. 4 shows the micrographs of the side surface of the substrate 5 each of which is taken by an optical microscope after the division. In FIG. 4, the thickness of the sapphire substrate is approximately 150 μm. However, according to this method, the altered area 20 that is formed in the inside of the sapphire substrate 5 by laser irradiation reaches to the front surface of the sapphire substrate 5, which in turn may cause a problem that fragments of the sapphire substrate 5 are produced as shown in FIG. 5. FIG. 5 shows the micrograph of the wafer, which is taken from the back-surface side of the sapphire substrate 5 by the optical microscope. From this micrograph, it can be seen that the division lines extend in zigzag in the case where the altered areas 20 reach the back surface of the sapphire substrate 5. In addition, it can be seen that the fragments of the substrate are produced from the enlarged view in FIG. 4.

Also, conventionally, it is understood that if the inside of the altered area, which is formed by first laser irradiation, is set as the light-condensing position and then irradiated with second laser beam, such second laser irradiation after the first laser irradiation is ineffective. The reason is that it has been considered that the second laser beam in the second laser irradiation is diffused by such an uneven medium (surface with asperities) in the altered area, which prevents the second laser beam from being condensed.

Figure 6A:
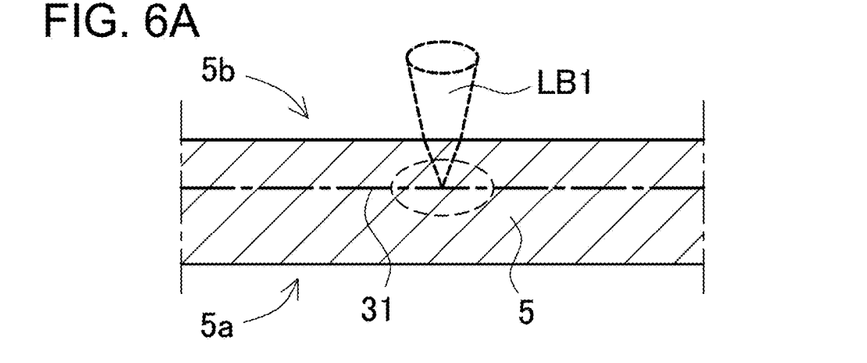
FIG. 6A is a schematic cross-sectional view showing the process for irradiating a first light-condensing position with first laser beam from the back-surface side of a substrate in first scanning.
Figure 6B:
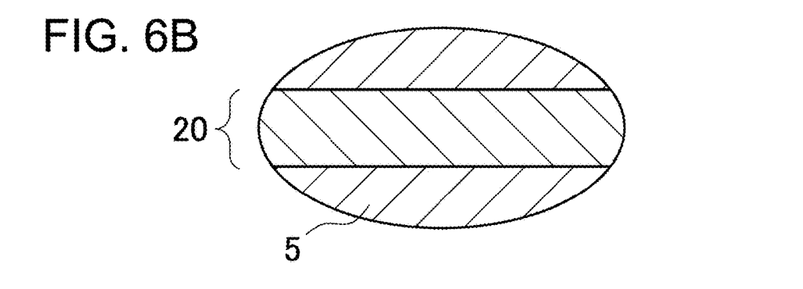
FIG. 6B is an enlarged schematic cross-sectional view of FIG. 6A.
Figure 6C:
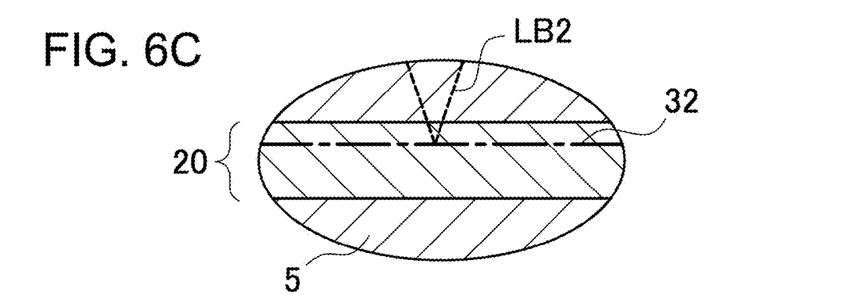
FIG. 6C is a schematic cross-sectional view showing the process for irradiating a second light-condensing position of the substrate shown in FIG. 6B with second laser beam in second scanning.
Figure 6D:
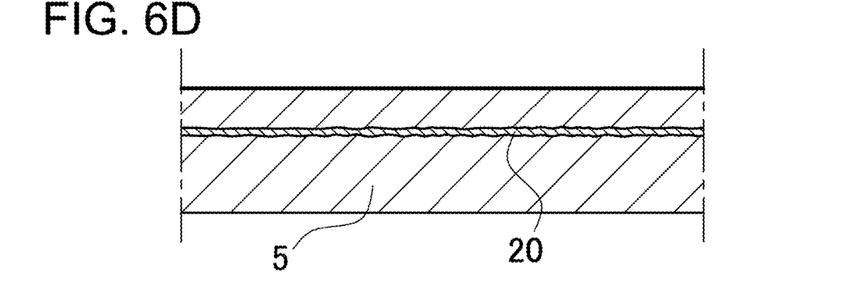
FIG. 6D is a schematic cross-sectional view showing a crack extending after the irradiation shown in FIG. 6C.

The inventors have diligently studied, and as a result have devised that the crack extension is facilitated by irradiating the altered area, which is formed by the first laser irradiation, as the light-condensing position with second laser beam on purpose although it is not considered that the altered area is newly formed by the laser irradiation in the second scanning. FIGS. 6A to 6D are schematic cross-sectional views showing the processes of the method according to the first embodiment. After the wafer, which includes the semiconductor structure 11 on the surface (first main surface 5a side) of the substrate 5, is prepared, the substrate 5 is irradiated with first laser beam LB1 in the first scanning from the back surface (second main surface 5b) side of this substrate 5 in the thickness direction of the substrate 5, in other words, first light-condensing positions 31 in the depth direction of the substrate 5 inside the substrate 5 is irradiated with first laser beam LB1 as the first scanning, as shown in FIG. 6A. In this process, the light-condensing position of first laser beam LB1 is adjusted to the first light-condensing position 31 whereby condensing the first laser beam LB1 to the first light-condensing position 31. Since the altered areas 20 are formed in the parts irradiated by the first laser beam LB and their peripheral parts of the sapphire substrate. Scanning the sapphire substrate with the first laser beam LB1 in the horizontal direction allows the altered area 20 to be formed in belt shapes in a cross-sectional view. The altered areas 20 are formed in belt shapes by the first laser irradiation process as shown in the enlarged cross-sectional view of FIG. 6B. Subsequently, as shown in FIG. 6C, in the altered areas 20, second light-condensing positions 32 that are located at positions different from the first light-condensing positions 31 in the thickness direction of the substrate 5 are irradiated with second laser beam LB2 as the second scanning. The second laser irradiation process facilitates the extension of cracks CR, and can reduce the time period for the extension of cracks CR to the second main surface 5b of the substrate 5. According to the processes, the wafer can be divided into semiconductor light emitting elements within a short time.

Figure 7:
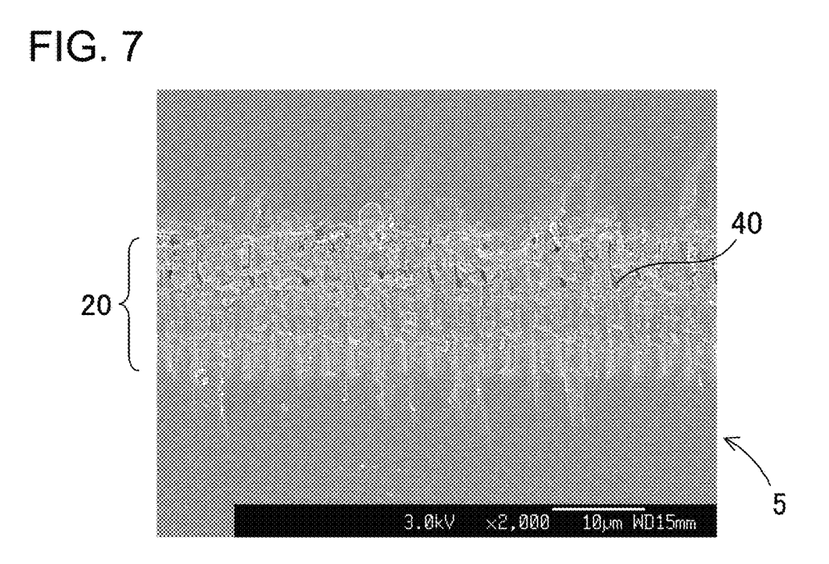
FIG. 7 is a SEM photograph showing the separated surface including the altered area, which is formed by the irradiation of second laser beam according to the embodiment of the present invention.

FIG. 7 shows a scanning electron microscope (SEM) photograph of the wafer including the altered area 20, which is formed by the production method according to the first embodiment of the present invention, after the wafer is divided into chips. In the case of FIG. 7, the laser irradiation (second scanning) in the second laser irradiation process is conducted on the second light-condensing positions 32 in the altered areas 20, which are formed in the vicinity of regions of the first light-condensing positions 31 by the laser irradiation in the first laser irradiation process (first scanning) conducted on the first light-condensing positions 31. Since a thickness of the belt-shaped altered areas 20 obtained after the second laser irradiation process is substantially similar to a thickness of the altered areas that are formed by only the first laser irradiation process, it is believed that another altered areas which are similar to the altered areas 20 formed in the first laser irradiation process are not newly formed in the second light-condensing position 32 in the second laser irradiation process. Also, on the side surface of the substrate 5 of the semiconductor light emitting element, it can be seen that recessed parts 40 are formed in the altered area 20, which is formed in the first laser irradiation process. The recessed parts are formed in a region closer to the second main surface 5b than a middle of the substrate in the thickness direction of the substrate 5. Shapes of the recessed parts 40 include an elongated shape extending in the thickness direction of the substrate and a shape that two recessed parts are connected or aligned in the thickness direction of the substrate 5.

As discussed above, although it is unclear why the extension of cracks is facilitated by exposure of the inside of the altered area to second laser beam, which is conventionally considered to be an ineffective process, it can be assumed that a compression stress that prevents the extension of cracks inside the sapphire substrate is released by application of thermal energy by the laser or the like, although the laser beam may be prevented from condensing in the altered area and thus an effect of producing another altered area may not be obtained.

The laser irradiation of the second scanning is not aimed at forming the altered area, but aimed at facilitating the extension of crack whereby reducing the waiting time until the cracks extend and reach the back surface of the substrate 5. As a result, the wafer can be divided into chips within a short time. Therefore, the cycle time for producing light emitting elements can be short. Further, according to this method, it is not considered that the laser irradiation in the second scanning produces another altered area or expands the altered area.

In addition, extension of the crack can be facilitated without irradiating the parts in proximity to the back surface of the substrate in the thickness direction of the substrate with the scanned laser beam. As a result, the production of substrate fragments can be avoided. Also, splits and chipping can be reduced, so that yields can be improved. It is preferable that the distance between the altered area 20 and the back surface of the substrate 5 is not smaller than 10 µm. In addition, it is preferable that the second light-condensing position 32 to be scanned by the second laser beam in the second scanning is provided closer to the second main surface 5b (back surface) side of the substrate 5 than the first light-condensing position 31 in the altered area 20 in the thickness direction of the substrate. Accordingly, the extension of cracks toward the back surface of the substrate 5 can be further facilitated. For example, the second light-condensing position 32 is spaced at a distance of 5 µm or more away from the first light-condensing position 31. The first light-condensing position 31 and the second condensing portion 32 may or may not be formed in a line parallel to the thickness direction.

Figure 8:
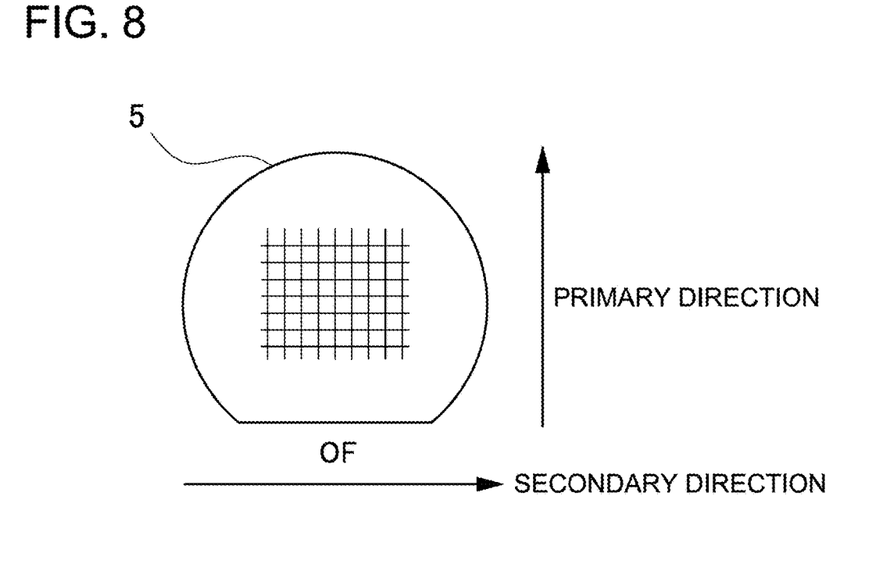
FIG. 8 is a schematic cross-sectional view showing the scanning directions of laser beam in the substrate.

The laser beam LB is scanned along a line for dividing the wafer (imaginary dividing lines) in the horizontal plane of the wafer. As an example, as shown in a plan view of FIG. 8, directions that extend substantially in perpendicular and parallel with respect to the orientation flat OF (e.g., the a-plane of the sapphire) of the wafer are defined as primary and secondary directions, respectively. The first scanning and the second scanning are first conducted in the secondary direction of the wafer. Then, first scanning and the second scanning are conducted in the primary direction of the wafer.

The width of the altered area 20 refers to the width in the thickness direction of the sapphire substrate 5, and is determined by the irradiation width (i.e., the spot diameter) of the laser beam LB. The spot diameter can be adjusted in accordance with the output, the defocusing amount, or the like of laser beam. In this embodiment, the width of the altered area 20 is within the range between 15 and 35 µm. In this case, the absorption of light is suppressed in the altered area which is irradiated with the laser beam, and the light output of the semiconductor light emitting element can be improved.

(Laser Beam LB)

Various types of laser sources can be used for irradiation with the laser beam LB, such as laser elements capable of operating a pulse laser or a continuous wave laser which are capable of inducing multiphoton absorption. In particular, a laser source for operating a pulse laser such as a femtosecond laser or a picosecond laser is preferable. A wavelength of the laser beam is not limited, and a laser beam having a center wavelength in the range of 800 to 1100 nm can be used, for example. Specifically, various lasers such as titanium sapphire laser, Nd:YAG laser, Nd:YVO$_4$ laser, and Nd:YLF laser can be used. A laser for emitting laser beam LB with a pulse width in the range of 400 to 700 fsec can be used. In the first embodiment, a femtosecond laser is used which have a center wavelength of 800 nm. A high-output femtosecond pulse laser can be suitably used to alter the properties of the substrate, since this laser can efficiently focuses the laser beam onto a position inside the sapphire substrate.

In addition, the method preferably includes a process for reducing the thickness of the substrate 5 before the first and second laser irradiation processes after the semiconductor structure 11 is grown. The substrate 5 can be polished and/or ground from the second main surface 5b (back surface) side to reduce the thickness of the substrate 5. In this process, it can be considered that the extension of cracks may be prevented by application of a compression stress to the parts of the substrate in proximity to the back surface, or the like in some means. Even in such a case, the extension of cracks can be facilitated by the method according to the present embodiment.

The semiconductor light emitting element produced by the method according to the present embodiment includes the substrate 5, and the semiconductor structure 11, which is deposited on the first main surface 5a of the substrate, as shown in FIG. 1. The altered area is formed at a position in the side surface of the substrate 5 so as to be closer to the second main surface 5b side, which is opposite to the first main surface 5a in the thickness direction of the substrate 5.

Second Embodiment

Figure 9A:
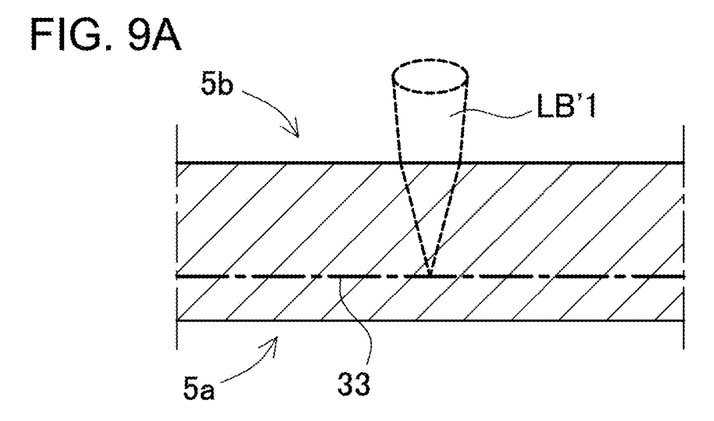
FIG. 9A is a schematic cross-sectional view showing the process for irradiating a third light-condensing position with third laser beam in first scanning according to the second embodiment.
Figure 9B:
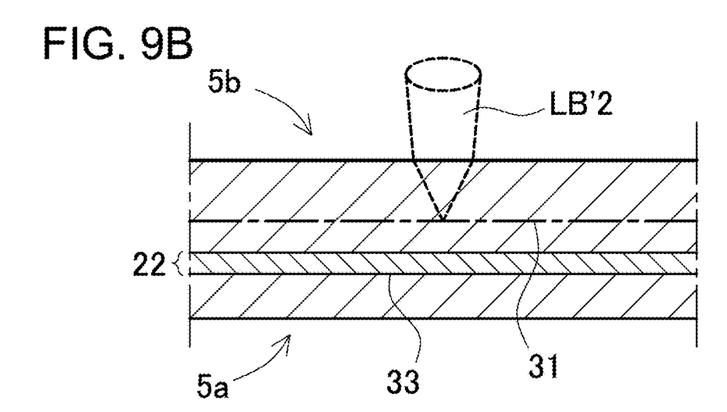
FIG. 9B is a schematic cross-sectional view showing the process for irradiating a first light-condensing position of the substrate shown in FIG. 9A with second laser beam in second scanning.
Figure 9C:
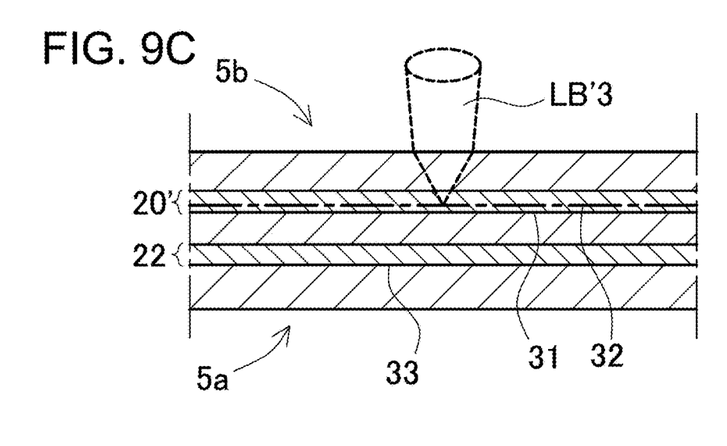
FIG. 9C is a schematic cross-sectional view showing the process for irradiating a second light-condensing position of the substrate shown in FIG. 9B with third laser beam in third scanning.
Figure 10:
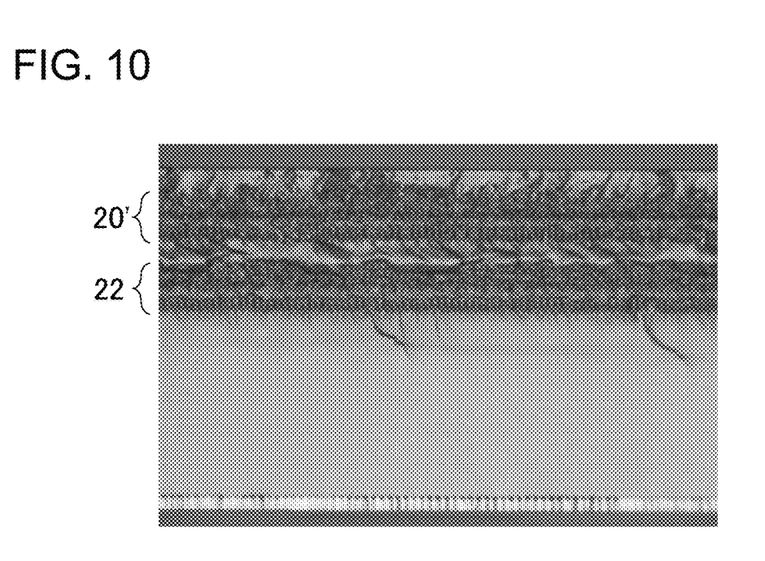
FIG. 10 is a SEM photograph showing the separated side surface of the sapphire substrate after the three laser irradiation processes shown in FIGS. 9A to 9C.

Although it has been described that two laser beam irradiation processes are conducted as the first and second laser irradiation processes in the foregoing embodiment, three or more laser beam irradiation processes can be conducted. For example, the method can further include a third laser irradiation process for irradiating a third light-condensing position with the third laser beam prior to the first laser irradiation process. According to this, the extension of cracks toward the first main surface side of the substrate can be further facilitated. Exemplary processes of such processes according to a second embodiment are shown in schematic cross-sectional views of FIGS. 9A to 9C. In the exemplary process shown in FIG. 9A as the third laser irradiation process, the third light-condensing position 33 is first irradiated with first laser beam LB'1 in a first scanning so that second altered areas 22 are formed. Subsequently, as shown in FIG. 9B, the first light-condensing position 31 is irradiated with second laser beam LB'2 in a second scanning as the first laser irradiation process, so that first altered areas 20' are formed. In addition, as shown in FIG. 9, the second light-condensing position 32 is irradiated with third laser beam LB'3 in a third scanning as the second laser irradiation process. FIG. 10 is a photograph showing the separated side surface of a wafer after the substrate 5 is irradiated with laser beam three times and divided into pieces.

In the present embodiment, it is preferable that the first and third light-condensing positions 31 and 33 be set so as to avoid overlapping between the second altered area 22, which is formed in the third laser irradiation process, and the first altered area 20', which is formed in the first laser irradiation process following the third laser irradiation process. As discussed above, since a plurality of altered areas are spaced away from each other in the thickness direction of the substrate, the extension of cracks in the thickness direction of the substrate can be further facilitated. Therefore, the substrate can be easily divided into pieces. In particular, the present embodiment is advantageous in the case where the substrate 5 to be divided is thick. For example, even in the case where a sapphire substrate has a thickness of 200 to 250 μm, the sapphire substrate can be divided into pieces by the method according to this embodiment.

In this embodiment, the third light-condensing position 33 is located closer to the front surface of the substrate 5 (i.e., first main surface 5a) than the first light-condensing position 31. According to this, it can be avoided that substrate fragments are produced on the back-surface side of the substrate 5.

Experimental Evaluations

Figure 11:
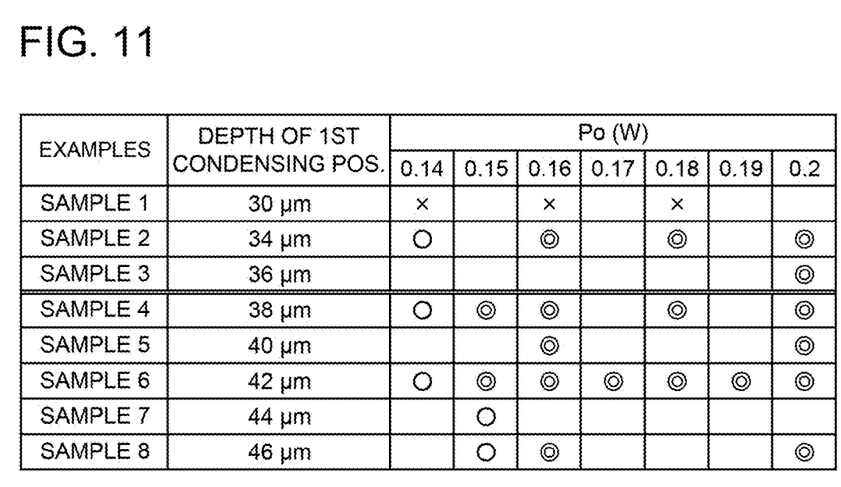
FIG. 11 is a table showing the evaluation results of samples which are produced by irradiating different light-condensing positions of the sapphire substrates with laser beam.

In order to confirm the advantages of the method of producing a light emitting element according to the embodiments of the present invention, sapphire substrates 5 are evaluated which are produced by methods in which the light-condensing position of the laser beam in the sapphire substrate 5 is varied. FIG. 11 shows a table of the evaluation results. In the evaluation, wafers are prepared each of which includes the sapphire substrate 5 having GaN group semiconductor structures, which are deposited on the substrate. The sapphire substrate has a thickness of 150 μm. Subsequently, two laser irradiation processes are conducted on the sapphire substrate 5 from the back-surface side. In the experiment on examples, light emitting elements with various distances from the back surface to the first light-condensing position 31 are evaluated on the conditions that the laser output $P_o$ of the first scanning is set as same as the second scanning, and the second light-condensing position 32 of the second laser beam in the second scanning is set to 30 μm from the back surface of the sapphire substrate 5. The scanning speed of the laser beam is set to 300 mm/s. Laser beam is first scanned in a direction substantially parallel to the orientation flat, and is then scanned in a direction substantially perpendicular to the orientation flat. A femtosecond pulse laser with a wavelength of 800 nm and a pulse width of 550 fsec is used as the laser beam machine.

Under the aforementioned conditions, the extension progress of cracks on the second main surface 5b side of each sapphire substrate 5 is observed with various first condensing positions 31, each of which is a position where first laser beam in the first scanning is concentrated, and various laser outputs $P_o$. The depth of the first light-condensing position 31 shown in the table is defined as the depth of the first condensing position from the back surface of the sapphire substrate 5. In the evaluation result, Double circles show samples in which the cracks reach the back surface of the substrate 5 within a short time.

Single circles show samples in which the cracks reach the back surface of the substrate 5 slower than the double circles but within a relatively short time. Crosses show samples in which extension of cracks to the back surface of the substrate 5 takes several hours or more. The external appearances of the chips are visually evaluated.

It is clear from FIG. 11 that extension of cracks to the back surface of the substrate takes a long time in the case where the depth of the first light-condensing position 31 from the back surface in the second scanning is set as the same as the first scanning (sample 1). Contrary to this, it is observed that the cracks efficiently extend in the samples in which the light-condensing position of the laser beam is set within the range of 34 to 46 μm from the back surface of the substrate 5, in other words, the samples which can be considered that the second light-condensing position 32 in the second scanning is set at a position in the altered area 20, which is formed by the laser irradiation in the first scanning, but different from the first light-condensing position 31.

As is appreciated from above evaluations, the method for producing a semiconductor light emitting element according to the embodiments of the present invention can facilitate extension of the crack, and thus the substrate 5 can be easily divided into chips. As a result, the production efficiency of the semiconductor light emitting elements can be increased. Also, since the sapphire substrate 5 can be easily divided into chips, the method according to the embodiments of the present invention can be applied to semiconductor light emitting elements in which the thickness of the sapphire substrate 5 is large. In particular, in the case where the thickness of the sapphire substrate 5 is large, the light extracting efficiency can be improved. From this viewpoint, it can be considered that high light output semiconductor light emitting elements can be produced at high production efficiency by the method according to the embodiments of the present invention. In addition, it is not required to form a large altered area when the substrate is divided into chips.

It is noted that, although it has been illustratively described that the substrate is irradiated with laser beam from the back surface side (i.e., second main surface 5b side) of the substrate in the foregoing embodiments, the substrate may be divided by irradiating the substrate with laser beam from the first main surface 5a side where the semiconductor structure is grown.

The embodiments and/or experimental evaluations according to the embodiments of the present invention have been described with reference to the drawings. It should be appreciated, however, that the foregoing embodiments and evaluations are illustrations of a method for producing a semiconductor light emitting element to give a concrete form to technical ideas of the invention, and a method for producing a semiconductor light emitting element is not specifically limited to them. Furthermore, it should be appreciated that the members shown in claims attached hereto are not specifically limited to members in the embodiments. Unless otherwise specified, any dimensions, materials, shapes and relative arrangements of the parts described in the embodiments are given as an example and not as a limitation. Additionally, the sizes and the positional relationships of the members in each of drawings are occasionally shown exaggeratingly for ease of explanation. Members same as or similar to those of this invention are attached with the same designation and the same reference signs, and their detailed description is omitted. In addition, a plurality of structural elements of the present invention may be configured as a single part that serves the purpose of a plurality of elements, on the other hand, a single structural element may be configured as a plurality of parts that serve the purpose of a single element.

A method for producing a semiconductor light emitting element according to the embodiments of the present invention can be applied to methods for producing semiconductor light emitting elements such as LEDs and laser elements to be used for light sources for lightings, LED displays, back light sources, signal lights, illuminated switches, various types of sensors and indicators and the like, and other semiconductor light emitting elements.

It should be apparent to those with an ordinary skill in the art that while various preferred embodiments of the invention have been shown and described, it is contemplated that the invention is not limited to the particular embodiments disclosed, which are deemed to be merely illustrative of the inventive concepts and should not be interpreted as limiting the scope of the invention, and which are suitable for all modifications and changes falling within the scope of the invention as defined in the appended claims.

According to embodiments of the present invention, since extension of cracks is facilitated, a wafer can be divided into chips within a short time. Therefore, the cycle time for producing a semiconductor light emitting element can be short.

The above and further objects of the present invention as well as the features thereof will become more apparent from the following detailed description to be made in conjunction with the accompanying drawings.

What is claimed is:

1. A semiconductor light emitting element comprising:
a substrate having a first main surface, a second main surface opposite to said first main surface and a first altered area defined partially between said first main surface and said second main surface in a thickness direction of said substrate, said first altered area having first voids positioned at a first imaginary line in said first altered area and second voids positioned at a second imaginary line different from the first imaginary line; and
a semiconductor structure provided on or above the first main surface of the substrate,
wherein the first altered area is a brittle portion around the first imaginary line,
wherein the second imaginary line is spaced at a distance of 5 μm or more away from the first imaginary line and within said first altered area,
wherein the width of the first altered area is within the range between 15 and 35 μm, and
wherein the first altered area is provided in a first half of the substrate in the thickness direction that includes the second main surface, and no additional altered area is provided in a second half of the substrate in the thickness direction that includes the first main surface.

2. The semiconductor light emitting element according to claim herein the substrate has a second altered area located closer to the first main surface than the first altered area.

3. The semiconductor light emitting element according to claim 2, wherein the width of the second altered area is within the range between 15 and 35 μm.

4. The semiconductor light emitting element according to claim 3, wherein the first altered area and the second altered area are formed in belt shape.

5. The semiconductor light emitting element according to claim 2, wherein the first altered area and the second altered area are formed in belt shape.

6. The semiconductor light emitting element according to claim 1, wherein the substrate is a sapphire substrate.

7. The semiconductor light emitting element according to claim 1, wherein the second main surface is laser beam irradiation surface having a first light-condensing position in a thickness direction of the substrate into which a first laser beam is irradiated to form the first altered area.

8. The semiconductor light emitting element according to claim 7, wherein the second main surface has a second light-condensing position into which the first laser beam is irradiated, the second light-condensing position being located at a position in the first altered area, the position being different from the first light-condensing position in the thickness direction of the substrate.

9. The semiconductor light emitting element according to claim 8, Wherein the first and second laser beam are femtosecond laser beam.

10. The semiconductor light emitting element according to claim 1,
wherein the first imaginary line extends substantially within a first imaginary plane that is parallel to said second main surface, and
wherein the second imaginary line extends substantially within a second imaginary plane that is parallel to said second main surface.

11. The semiconductor light emitting element according to claim 10, wherein the first imaginary plane is positioned farther from said second main surface than the second imaginary plane.

12. A semiconductor light emitting element comprising:
a substrate having a first main surface, a second main surface opposite to said first main surface and a first altered area defined partially between said first main surface and said second main surface in a thickness direction of said substrate, said first altered area having first voids positioned at a first imaginary line in said first altered area and second voids positioned at a second imaginary line different from the first imaginary line, the second imaginary line being within said first altered area; and
a semiconductor structure provided on or above the first main surface of the substrate,
wherein the first altered area is a brittle portion around the first imaginary line,
wherein the width of the first altered area is within the range between 15 and 35 μm, and
wherein the first altered area is provided in a first half of the substrate in the thickness direction that includes the second main surface, and no additional altered area is provided in a second half of the substrate in the thickness direction that includes the first main surface.

13. The semiconductor light emitting element according to claim 12, wherein the substrate has a second altered area located closer to the first main surface than the first altered area.

14. The semiconductor light emitting element according to claim 13, wherein the substrate is a sapphire substrate.

15. The semiconductor light emitting element according to claim 14, wherein the width of the second altered area is within the range between 15 and 35 μm.

16. The semiconductor light emitting element according to claim 14, wherein the first altered area and the second altered area are formed in belt shape.

17. The semiconductor light emitting element according to claim 13, wherein the width of the second altered area is within the range between 15 and 35 μM.

18. The semiconductor light emitting element according to claim 12, wherein the substrate is a sapphire substrate.

* * * * *